(12) United States Patent
Rieger et al.

(10) Patent No.: US 6,366,511 B2
(45) Date of Patent: Apr. 2, 2002

(54) METHOD FOR CHECKING A SEMICONDUCTOR MEMORY DEVICE

(75) Inventors: Johann Rieger, Zell; Thomas Von Der Ropp, Germering, both of (DE)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 09/910,745

(22) Filed: Jul. 23, 2001

Related U.S. Application Data

(63) Continuation of application No. 08/616,211, filed on Mar. 15, 1996, now abandoned.

Foreign Application Priority Data

Mar. 15, 1995 (EP) .............................. 95103791

(51) Int. Cl.⁷ ................................................ G11C 7/00
(52) U.S. Cl. ...................................... 365/201; 365/210
(58) Field of Search ................................ 365/200, 201, 365/210

(56) References Cited

U.S. PATENT DOCUMENTS 4,409,676 A 10/1983 Yarshney .................... 365/201
4,816,757 A 3/1989 Hutchins .................... 324/158
5,184,326 A 2/1993 Hoffmann et al. .......... 365/201

FOREIGN PATENT DOCUMENTS

EP 0 387 379 A1 9/1990
EP 0 411 594 A3 2/1991

*Primary Examiner*—A. Zarabian
(74) *Attorney, Agent, or Firm*—Herbert L. Lerner; Laurence A. Greenberg; Werner H. Stemer

(57) ABSTRACT

A method for checking a semiconductor memory device integrated on a semiconductor chip includes providing the semiconductor memory device with a plurality of memory cells each being disposed on a semiconductor substrate for one binary information value, data lines for reading out and writing in information values, gate transistors being associated with the memory cells for selectively clearing a data path between a given memory cell and a data line, selection lines for purposefully triggering the gate transistors, and at least one in-chip reference voltage being adjusted to a predetermined normal value when the semiconductor memory device is functioning as intended. The method for checking the semiconductor memory device integrated on a semiconductor chip is carried out by at least intermittently varying the at least one in-chip reference voltage, and detecting and weighting the information values read out at the at least intermittently varied reference voltage.

7 Claims, 1 Drawing Sheet

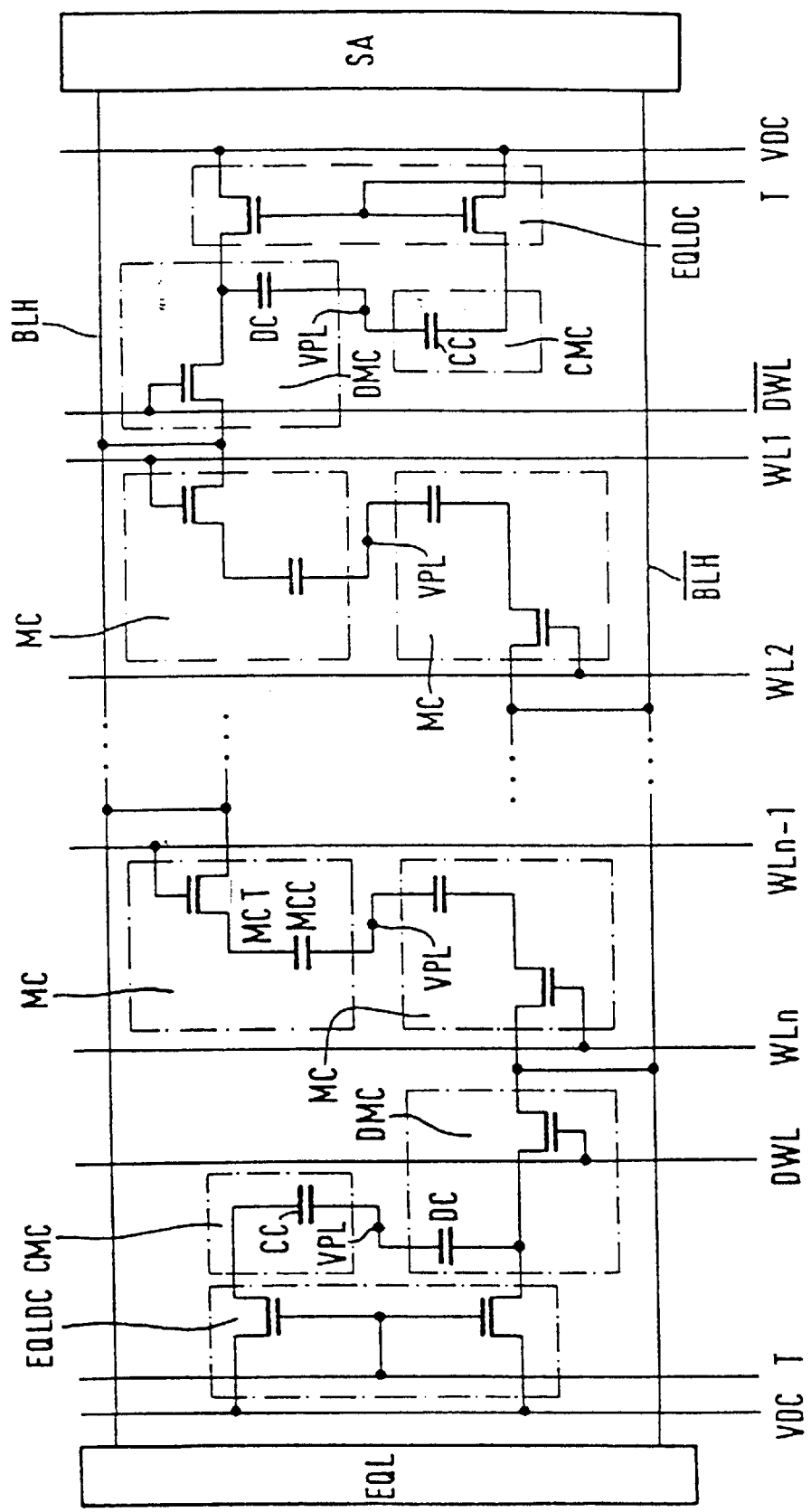

METHOD FOR CHECKING A SEMICONDUCTOR MEMORY DEVICE

CROSS-REFERENCE TO RELATED APPLICATION

This is a continuation of U.S. application Ser. No. 08/616,211, filed Mar. 15, 1996 now abandoned.

BACKGROUND OF THE INVENTION

Field of the Invention

The invention relates to a method for checking a semiconductor memory device which is constructed in integrated form on a semiconductor chip, with a plurality of memory cells disposed on a semiconductor substrate, each for one binary information value, data lines for reading out and writing in information values, gate transistors associated with the memory cells for selectively clearing a data path between a given memory cell and a data line, selection lines for purposefully triggering the gate transistors, and at least one in-chip reference voltage which is adjusted to a predetermined normal value when the semiconductor memory device is functioning as intended.

With increasing complexity and memory depth of a semiconductor memory device constructed in integrated form on a semiconductor chip, especially in the case of a dynamic random access memory device (a so-called DRAM), the test methods, or test programs if a computer is used, to be carried out for testing the functional capability of the semiconductor memory device, preferably before the semiconductor chip is encapsulated in a housing, become more and more extensive, and the time taken by the individual tests becomes longer and longer, so that performing the tests requires ever greater effort. The goal of such a method or test program is not only to check the memory chip for its basic functional capability with adequate margins, but also especially to track down defective or weak memory cells so that they can be replaced, optionally by using redundant cells that are also present on the chip.

Integrated semiconductor memory devices, especially those of the one-transistor memory cell type, are vulnerable to so-called soft errors, that is alpha rays that typically originate in the component housing being used. Experiments have shown that the semiconductor memory circuits react variously markedly to those alpha rays, depending on whether an information value was supposed to be stored as a physical zero or a physical one (a physical zero can correspond to a logical 0 value, but can also correspond to a logical 1 value, with the association being dependent on the particular circuitry chosen). It has been found that that is the consequence of a so-called weighting asymmetry in the reading amplifier, so that a stored datum of physical zero cannot be read out with the same certainty and safety margin as a stored datum of physical one, and vice versa. Thus the danger of soft errors increases with respect to the one type of datum, while it decreases for the other type of datum. Therefore, depending on the types of data, it is also complicated to detect defective or weak memory cells.

It is not yet possible with conventional test programs to detect and reject all of the memory cells that for process reasons (being particle-induced, for instance) furnish a poor reading signal, yet such cells represent a potential risk to the customer because under special conditions they can still cause failure. That directly worsens the quality of the products being furnished. In order to solve that problem, the methods and test programs used thus far for checking a semiconductor memory device have been made longer and more precise. However, on one hand, such extensive test programs require a considerable expenditure of time for complete checking of a semiconductor memory device, while on the other hand, it has been found that at least sometimes, the attainable rejection rate, even with extensive test programs, is not especially high or adequate.

SUMMARY OF THE INVENTION

It is accordingly an object of the invention to provide a simple method for checking a semiconductor memory device constructed in integrated form on a semiconductor chip, which overcomes the hereinafore-mentioned disadvantages of the heretofore-known methods of this general type, which can be carried out without major expenditure of time or labor and which enables the most complete possible detection and rejection of defective or weak memory cells.

With the foregoing and other objects in view there is provided, in accordance with the invention, a method for checking a semiconductor memory device integrated on a semiconductor chip, which comprises providing the semiconductor memory device with a plurality of memory cells each being disposed on a semiconductor substrate for one binary information value, data lines for reading out and writing in information values, gate transistors being associated with the memory cells for selectively clearing a data path between a given memory cell and a data line, selection lines for purposefully triggering the gate transistors, and at least one in-chip reference voltage being adjusted to a predetermined normal value when the semiconductor memory device is functioning as intended, and carrying out the method for checking the semiconductor memory device integrated on a semiconductor chip by at least intermittently varying the at least one in-chip reference voltage, and detecting and weighting the information values read out at the at least intermittently varied reference voltage.

In accordance with another mode of the invention, the in-chip reference voltage is thus lowered during some tests and raised during some tests. In this way, when the in-chip reference voltage is lowered, the reading signal of physical zeros decreases, or if the reference voltage is raised the reading signal of physical ones increases, so that memory cells which have reduced loading capacity or other defects furnish a reading signal that is too small for reliable weighting, and they can therefore be detected as weak or defective memory cells in a simple way and can optionally replaced by redundant cells.

In accordance with a further mode of the invention, in order to carry out the method of the invention, it is necessary that the in-chip reference voltage be varied temporarily or permanently from outside (increased or decreased as compared with the predetermined normal value) and/or adjusted.

In accordance with an added mode of the invention, this can be done either by impressing or programming the in-chip reference voltage from outside at a suitable terminal pad, or through so-called fuses (light fuses, laser fuses, electrical fuses or the like), which are constructed as irreversible switches on the chip in the form of redundant line connections that can be severed as needed, or within a test mode. In each case, through the use of a relatively simply accomplished variation of the in-chip reference voltage, a method for checking defective cells that is faster than previously known testing methods can be carried out with an adequately high rejection rate.

In accordance with a concomitant mode of the invention, the in-chip reference voltage is the supply voltage VDC of so-called dummy memory cells. In integrated semiconductor circuits, it is generally usual, before data are read out of the memory cells, to precharge the bit lines to a bit line potential VBL (generally known as a precharge operation or as charging with a precharge potential). This serves to effectively supply the reading amplifiers, which are generally flip-flop circuits that function differentially, after the readout for weighting and amplification of the reading signals, with only these reading signals, since the bit line potential VBL is present at both inputs of the reading amplifiers with the same value and thus is not taken into account by the differentially functioning reading amplifiers. Typically, a value is applied as the bit line potential VBL that corresponds to half the difference between the supply voltage potential VDD and the ground potential VCC. In semiconductor memory circuits that function internally of the circuit with a so-called internal supply voltage potential VDDint which is lowered, as compared with the supply potential present in the finished component, the corresponding half-difference between this internal supply voltage potential VDDint and the ground potential VSS is applied. If the semiconductor memory circuit also has the aforementioned dummy memory cells, then as a rule they too are charged to the bit line potential VBL. In such semiconductor memory circuits with dummy memory cells, it has been found that these circuits can effectively be checked only by varying the in-chip dummy cell supply voltage VDC.

Other features which are considered as characteristic for the invention are set forth in the appended claims.

Although the invention is illustrated and described herein as embodied in a method for checking a semiconductor memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic and block circuit diagram of the invention showing advantageous features.

DESCRIPTION OF THE PREFERRED EMBODIMENTS

Referring now in detail to the single figure of the drawing, there is seen a portion of an exemplary semiconductor memory circuit, in which the method according to the invention for checking memory cells can be used. The drawing shows two bit line halves BLH, $\overline{BLH}$ of a bit line BL, to which a reading amplifier SA is connected on one side, and to which a precharging device EQL is connected on the other side for precharging and (with respect to its electrical potential) setting the bit line halves BLH, $\overline{BLH}$ equal to a bit line potential VBL before a readout of data from memory cells MC.

Memory cells MC of one-transistor type which are also shown (with selection transistors MCT and memory capacitors MCC), on one hand are connected to the respective bit line half BLH, $\overline{BLH}$ and on the other hand are all connected in common (at first electrodes of their memory capacitors MCC) to a so-called plate potential VPL. This potential is substantially half the value of a difference between a supply voltage potential VDD (or an internal supply voltage potential VDDint) and a ground potential VSS. It is thus essentially equal to the bit line potential VBL that can be applied to the bit lines BL through the precharging device EQL. The plate potential VPL could also have essentially the same value as the supply voltage potential VDD (or that of the internal supply voltage potential VDDint) or the ground potential VSS, as was usual in the past.

The drawing also shows word lines WL which are serially numbered from WL1–WLn, for triggering the selection transistors MCT of the memory cells MC. Accordingly, as is generally usual, the memory cells MC are disposed at intersections between word lines WL and bit lines BL and can be connected through their selection transistors MCT to the various bit lines BL or bit line halves BLH, $\overline{BLH}$, for reading and storing information.

Each bit line half BLH, $\overline{BLH}$ has a so-called dummy cell DMC (that may, for instance, be disposed on its ends, as shown), which is also of the one-transistor cell type. It serves the purpose of uniform, symmetrical loading of the differentially functioning reading amplifiers SA during operation. Memory capacitors DC of the dummy cells DMC are also connected at first electrodes thereof to the plate potential VPL. The dummy cells DMC are connected to dummy word lines DWL, $\overline{DWL}$.

This semiconductor memory circuit also has equalization devices EQLDC through which second electrodes of each of the memory capacitors DC of the dummy memory cells DMC can be acted upon during operation with a precharging potential VDC. This action is carried out during a (conventional) precharging of the bit lines BL to the bit line potential VBL. The value of the precharging potential VDC is preferably from 5 to 35% greater than the value of half the difference between the supply voltage potential VDD (or VDDint if an internal supply voltage potential is used) and the reference potential VSS.

The devices EQLDC may, for instance, contain transistors as shown, which are connected on one hand to the precharging potential VDC and on the other hand to the second electrodes of the memory capacitors DC of the dummy cells DMC. The transistors are triggered at their gates by a precharging clock signal T, which makes the transistors conducting at the moment of the precharging. The precharging clock signal T can have the same chronological course as a corresponding non-illustrated clock signal, which controls the precharging of the bit lines BL to their bit line potential VBL before data are read out of the memory cells MC.

The drawing also shows peripheral cells CMC, which are generally known as "friendly cells". Their function is known to one skilled in the art. The friendly cells may include only friendly cell capacitors CC, as shown in this case. However, they can also further include transistors which are similar to the selection transistors MCT of the memory cells MC or those of the dummy cells DMC. Advantageously, first electrodes of the friendly cell capacitors CC are connected to the plate potential VPL, and second electrodes of these friendly cell capacitors CC can likewise be acted upon, through the use of the equalization devices EQLDC for the dummy cells DMC, with the precharging potential VDC of the dummy cells DMC. This produces even better symmetrizing of the operating and loading conditions of the reading amplifiers SA during both readout and weighting and amplification of the read-out data.

We claim:

1. A method for checking a semiconductor memory device integrated on a semiconductor chip, which comprises: providing the semiconductor memory device with:

a plurality of memory cells each formed on a semiconductor substrate for one binary information value, data lines for reading and writing in information values, gate transistors connected to the memory cells for selectively clearing a data path between a given memory cell and a data line, selection lines for purposefully triggering the gate transistors;

wherein an in-chip reference voltage is set to a predetermined normal value during normal operation of the semiconductor memory and, before data are read out of the memory cells, the data lines are precharged to a data line potential; and carrying out the method for checking the semiconductor memory device integrated on a semiconductor chip by:

varying the in-chip reference voltage independently of the data line potential; and detecting and weighting the information values read at the varied reference voltage.

2. The method for checking a semiconductor memory device integrated on a semiconductor chip according to claim 1, wherein the providing step comprises providing the semiconductor chip with a plurality of in-chip reference voltages and the varying step comprises varying each of the in-chip reference voltage independently of the data line potential.

3. The method for checking a semiconductor memory device integrated on a semiconductor chip according to claim 1, which comprises intermittently varying the in-chip reference voltage.

4. The method for checking a semiconductor memory device integrated on a semiconductor chip according to claim 1, which comprises:

lowering and raising the in-chip reference voltage relative to the normal value of the reference voltage in accordance with a predetermined, time-dependent pattern.

5. The method for checking a semiconductor memory device integrated on a semiconductor chip according to claim 1, which comprises:

carrying out the varying step from outside the chip.

6. The method for checking a semiconductor memory device integrated on a semiconductor chip according to claim 1, which comprises:

carrying out the varying step by adjusting suitable fuses integrated on the semiconductor chip.

7. The method for checking a semiconductor memory device integrated on a semiconductor chip according to claim 1, which comprises:

integrating dummy memory cells on the semiconductor chip with a dummy memory cell supply voltage defining the in-chip reference voltage.

* * * * *